United States Patent [19]

Lee

[11] Patent Number: 5,208,177
[45] Date of Patent: May 4, 1993

[54] LOCAL FIELD ENHANCEMENT FOR BETTER PROGRAMMABILITY OF ANTIFUSE PROM

[75] Inventor: Roger R. Lee, Boise, Id.

[73] Assignee: Micron Technology, Inc., Boise, Id.

[21] Appl. No.: 832,561

[22] Filed: Feb. 7, 1992

[51] Int. Cl.$^5$ .................. H01L 21/265; H01L 21/44
[52] U.S. Cl. .......................... 437/47; 437/52; 437/60; 437/203; 437/922
[58] Field of Search ............ 437/922, 52, 150, 48, 437/151, 47, 115.2, 60, 115.4, 919, 203, 228; 357/51, 235; 148/50, 35; 156/643; 257/301-316; 365/149, 154

[56] References Cited

U.S. PATENT DOCUMENTS

| 4,116,720 | 9/1978 | Vinson | 357/50 |
| 5,070,383 | 12/1991 | Sinar et al. | 357/51 |
| 5,110,754 | 5/1992 | Lowrey et al. | 437/52 |
| 5,118,638 | 6/1992 | Fujihira | 437/158 |

FOREIGN PATENT DOCUMENTS

| 0386947 | 9/1990 | European Pat. Off. | 437/919 |
| 3932621 | 4/1990 | Fed. Rep. of Germany | 437/203 |
| 2231718 | 11/1990 | United Kingdom | 437/52 |

Primary Examiner—Olik Chaudhuri
Assistant Examiner—Loc Q. Trinh
Attorney, Agent, or Firm—David J. Paul

[57] ABSTRACT

The present invention provides improved programmability of antifuse elements by utilizing local enhancement of an underlying diffusion region. During an existing fabrication of a semiconductor device using antifuse elements after the access lines (usually word lines) are formed, a self-aligning trench is etched between two neighboring access lines thereby severing an underlying diffusion region. Following an etch back of the access lines' spacers a low energy, heavy dose implant dopes the exposed edges of the diffusion region resulting from the spacer etch back, as well as the bottom of the trench. An antifuse dielectric is formed followed by placing of a second conductive access line (usually the source lines) thus filling the trench to serve as the programmable antifuse element. The heavily doped areas in the diffusion region will now allow a reduction in programming voltage level, while providing a sufficient rupture of the antifuse dielectric.

32 Claims, 3 Drawing Sheets

LOCAL FIELD ENHANCEMENT FOR BETTER PROGRAMMABILITY OF ANTIFUSE PROM

FIELD OF THE INVENTION

This invention relates to the field of semiconductor devices. More specifically, a concept is described which allows improved programmability of antifuse elements in semiconductor devices, such as non-volatile memory devices, by local field enhancement.

BACKGROUND OF THE INVENTION

A read only memory (ROM) consists of an array of semiconductor devices (diodes, bipolar or field-effect transistors) which interconnect to store an array of binary data (ones or zeros). A ROM basically consists of a memory array of programmed data and a decoder to select the data located at a desired address in the memory array.

Though there are three basic types of ROMs, mask-programmable ROMs, erasable programmable ROMs (EPROMs) and field-programmable ROMs (PROMs), the focus of the present invention is on PROMs.

PROMs are typically manufactured with all switching elements present in the array, with the connection at each row-column intersection being made by means of either a fuse element or an antifuse element. In order to store data in the PROM, these elements (either the fuse or the anti-fuse, whichever are used in the design) are selectively programmed using appropriate voltage pulses supplied by a PROM programmer. Once the elements are programmed, the data is permanently stored in the memory array.

However, the programming pulse required to rupture an antifuse element is normally in the neighborhood of 14–20 V. If this programming pulse can be reduced the semiconductor device would therefore be subjected to a less potentially damaging voltage. Ideally, the closer the programming pulse gets to normal operating voltages of a given device the better as larger devices normally required to handle large voltages can be reduced in size thereby reducing the potential problems of transistor punch through, gate oxide breakdown, etc.

The present invention focuses on substantially lowering the programming pulse by developing an antifuse element overlying a local field enhanced diffusion region.

SUMMARY OF THE INVENTION

The present invention provides improved programmability of antifuse elements by utilizing local field enhancement of an underlying diffusion region.

During an existing fabrication process of a semiconductor device using antifuse elements, after the access lines (usually word lines) are formed, a self-aligning trench is etched between two neighboring access lines thereby severing an underlying diffusion region. Following an etch back of the access lines, spacers, a low energy, heavy dose, implant dopes the exposed edges of the diffusion region that results from the spacer etch back. The bottom of the trench is doped as well. An antifuse dielectric is formed followed by placing of a second conductive access line (usually the source lines) thus filling the trench to serve as the programmable antifuse element. The heavily doped areas in the diffusion region will now allow a reduction in programming voltage level, while providing a sufficient rupture of the antifuse dielectric.

Though the present invention suggests using this local enhanced diffusion region to improve programmability of antifuse elements in a PROM it will be obvious to one skilled in the art to implement this approach into other programmable integrated circuits, such as programmable logic arrays (PLAs), programmable array logic (PALs), dynamic random access memories (DRAMs) and the like or simply logic circuits in general. For example, in DRAMs antifuse elements may be designed into the circuitry in order to provide means for redundancy repair or selecting certain options.

DETAILED DESCRIPTION OF THE PREFERRED EMBODIMENTS

The present invention provides improved programmability of antifuse elements by utilizing local field enhancement of an underlying diffusion region as described in a fabrication process depicted in FIGS. 1–4b.

Figure 1:
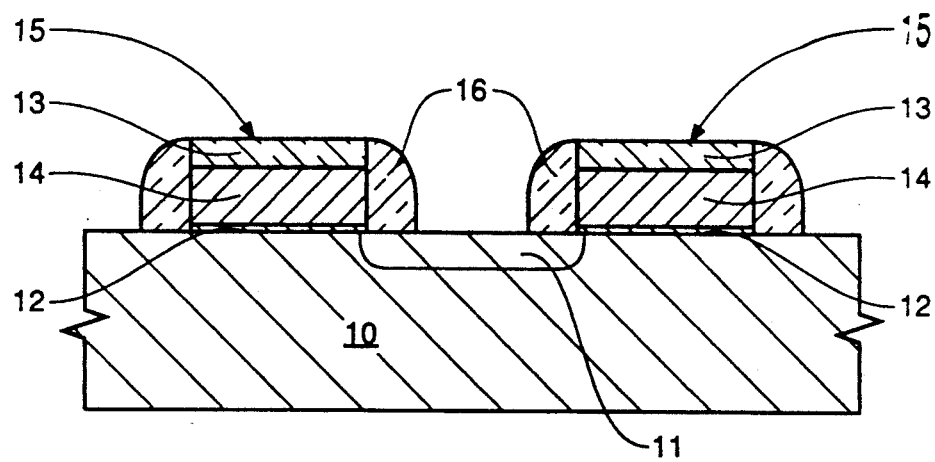
FIG. 1 shows a composite cross-sectional view of an in process wafer portion during fabrication of a PROM showing previously developed word lines, word line spacers and an underlying diffusion region.

FIG. 1 depicts a composite cross-sectional view of an in process wafer portion during conventional fabrication of a PROM prior to the formation of a one time programmable element. This cross-sectional view shows previously fabricated word lines 15 comprising patterned polysilicon 14 and patterned dielectric 13 being separated from underlying substrate 10 by thin gate dielectric 12. Word line spacers 16 are formed (after diffusion are 11 has been doped to a desired conductivity type) to complete insulation of word lines 15. Diffusion region 11 is typically doped to an N+ doping initially (as shown in FIG. 2b) or it may be doped as N− (as shown in FIG. 2a) prior to spacer 16 formation and then doped with a heavy doped implant (forming N+ conductivity) if a lightly doped drain (LDD) process is used.

Figure 2A:
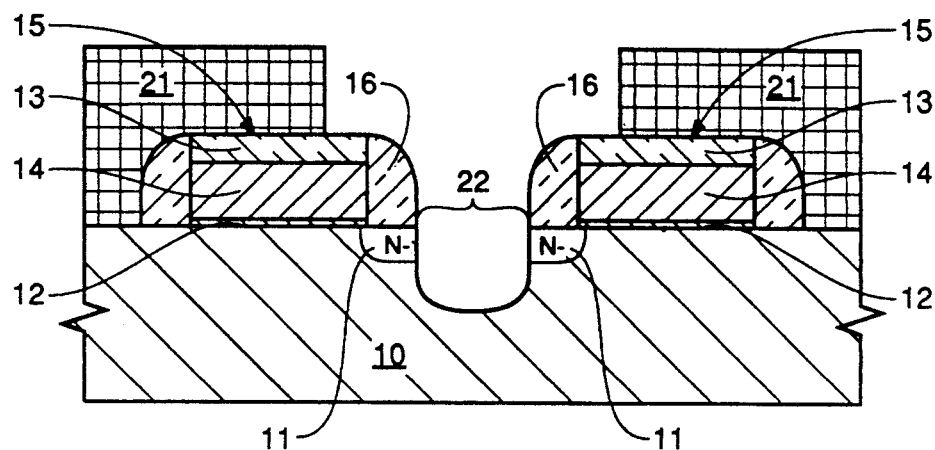
FIGS. 2a and 2b show cross-sectional views of the wafer portion of FIG. 1 following a masking step to allow a subsequent self-aligned trench etch.
Figure 2B:
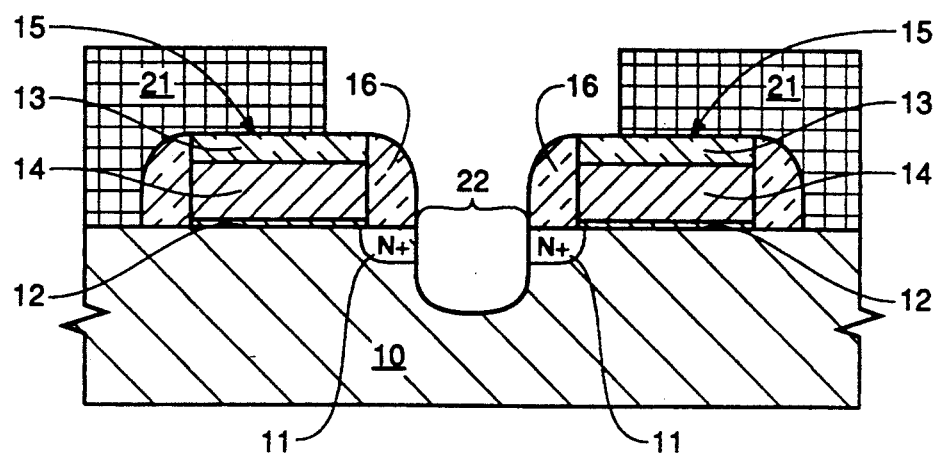

Referring now to FIGS. 2a or 2b, mask 21 (such a photoresist) is patterned thereby exposing the area spanning between neighboring word lines 15. Next an etch is performed that trenches into substrate 10 and severing diffusion region 11. The formation of trench 22 self-aligns itself to neighboring word lines 15 due to the presence of spacers 16.

Figure 3A:
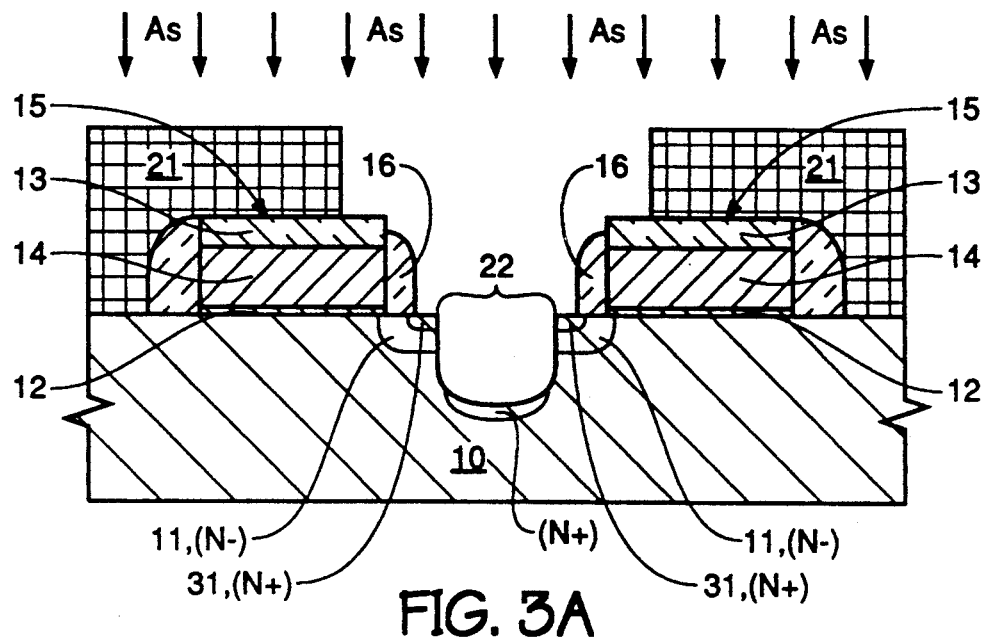
FIGS. 3a and 3b show cross-sectional views of the wafer portion of FIGS. 2a and 2b, respectively following a slight spacer etch back.
Figure 3B:
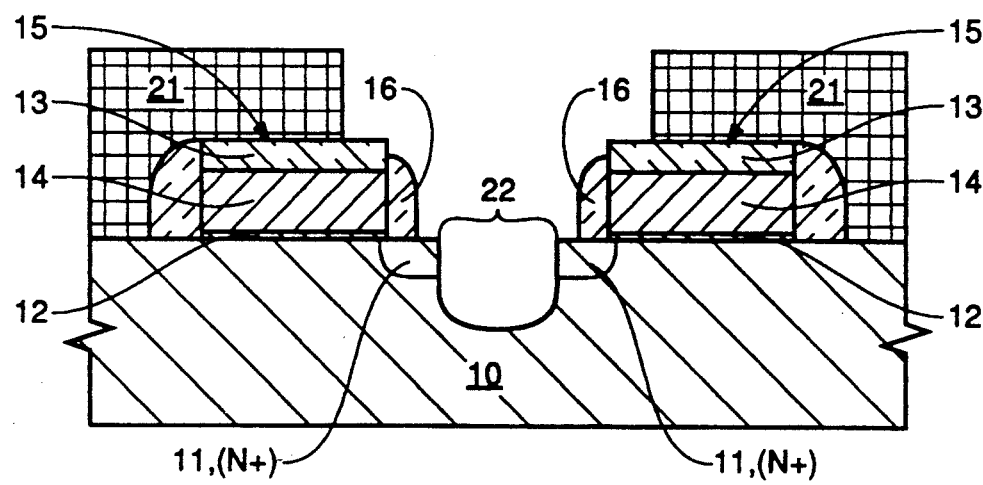
Figure 4A:
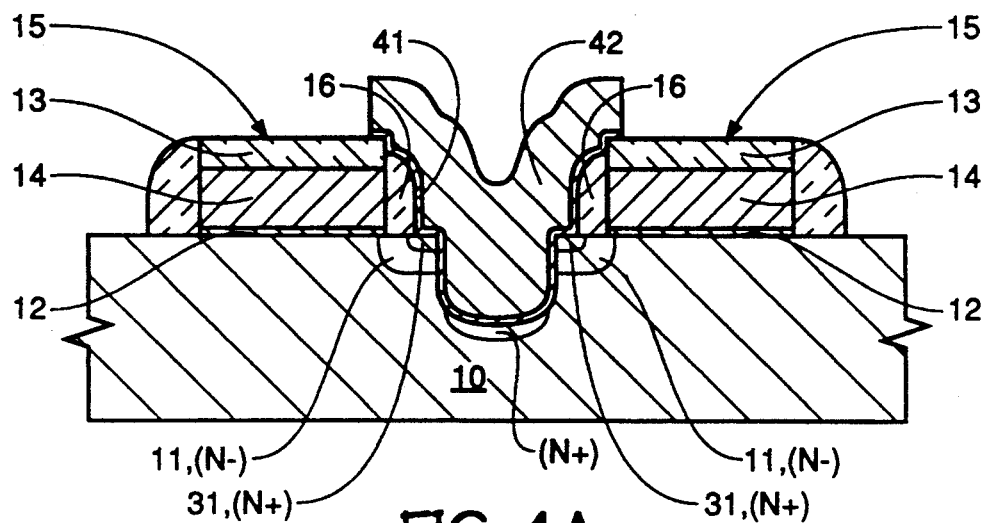
FIGS. 4a and 4b show cross-sectional views of the wafer portion of FIGS. 3a and 3b, respectively following antifuse dielectric deposition and word line poly deposition.
Figure 4B:
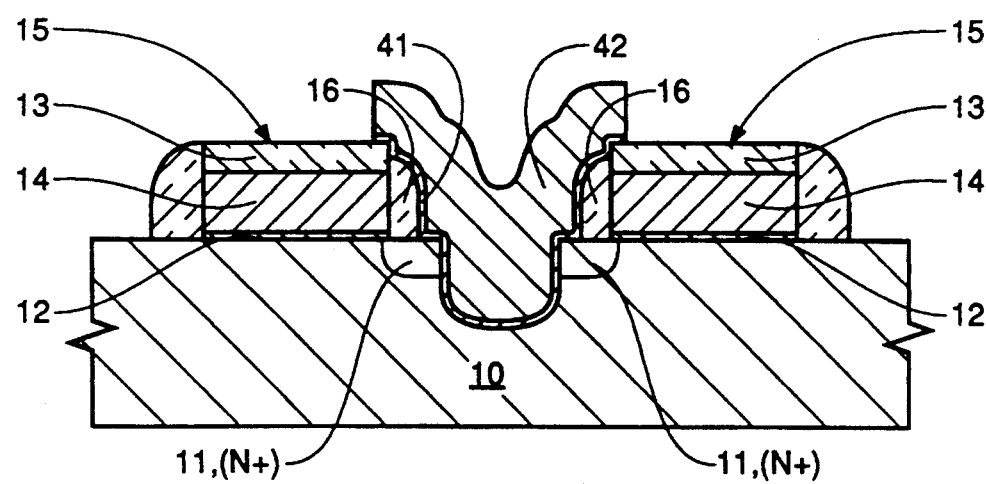

If a LDD process is used the present invention includes the steps depicted in FIG. 3a and continuing with process steps of FIG. 4a, however, if the heavy implant is performed initially, the process will use the process steps of FIG. 3b and continue with the steps depicted in FIG. 4b.

Taking the case of a LDD process in FIG. 3a, mask 21 remains and a spacer etch (such as a hydrofluoric etch) is performed to reduce spacers 16 and thereby expose the sharp edges 31 of diffusion region 11. Next, a low energy implant, such as a heavy dose of Arsenic is performed in order to dope diffusion region 11 at exposed edges 31 with a N+ dopant. This implant also dopes the bottom of trench 22 as N+.

Taking the case of a non-LDD process in FIG. 3b, mask 21 remains and a spacer etch (such as a hydrofluoric etch) is performed to reduce spacers 16 and thereby expose the sharp edges 31 of diffusion region 11.

The LDD process (described from FIGS. 2a and 3a) or the non-LDD process (described from FIGS. 2b and 3b) continue with the steps depicted in FIGS. 4a and 4b, respectively. Referring now to FIGS. 4a or 4b (again depending on the process), a conformal layer of antifuse dielectric 41 (normally a thin dielectric having high dielectric reliability characteristics) is deposited followed by deposition of polysilicon 42. Polysilicon 42 fills trench 22 to serve as an access line (or source line) to the memory array.

A programmable antifuse element now exists between N+ doped areas at edges 31 (in N− diffusion region 11) and polysilicon 42 which are separated by antifuse dielectric 41. The sharp N+ edges 31 are the significant developments in the present invention (present in both the LDD process and the non-LDD process) as they will cause a high electromagnetic field (E-field) at the edges 31 once the antifuse is subjected to programming pulses in order to rupture dielectric 41 and thereby shorting polysilicon 42 to N+ doped edges 31 and ultimately to diffusion region 11.

The E-field buildup is substantial enough to rupture antifuse dielectric 41 at a much lower programming voltage than is conventionally used. For example, programming voltage pulses have conventionally ranged from 14-20 V or above, meaning the fabricated transistors must be large enough to handle such large voltage spikes without sustaining any damage. By implementing the present invention, the antifuse may be programmed using a pulse under 14 V (a range from 10 to 12 V has proven to be sufficient), thus allowing access transistors in line with the programming pulses to be scaled down as now the programming voltage is not only a lesser potential but its duration maybe reduced as well. For example using conventional programming methods require a programming pulse width of several hundred μsec, whereas the present invention allows the pulse width to be reduced to under 50 μsec.

It is to be understood that although the present invention has been described with reference to a preferred embodiment, various modifications known to those skilled in the art, such as using this technique for other integrated circuits that utilize programmable antifuse elements or by using p-type conductivity rather than n-type or a combination thereof, may be made to the method presented herein without departing from the invention as recited in the several claims appended hereto.

I claim:

1. A fabrication method to improve programmability of a one time programmable element in an integrated circuit, said method comprising the steps of:

masking a diffusion region adjoining neighboring access lines thereby exposing a portion of said adjoining diffusion region, said diffusion region being heavily doped as a conductivity type, said access devices forming active metal oxide transistors having overlying insulation means and dielectric spacers for isolation and said diffusion region for source/drain regions;

b) trenching through said exposed diffusion region thereby severing said diffusion region and forming edges in said severed diffusion region self-aligned to lower outer surface of said dielectric spacers;

c) etching back said dielectric spacers thereby exposing said edges of severed diffusion region;

d) forming a dielectric layer superjacent and coextensive resulting trench, said exposed edges and said dielectric spacers; and e) forming a conductive layer superjacent and coextensive said dielectric thereby forming a programmable element comprising said dielectric layer sandwiched between said severed diffusion regions and said conductive layer.

2. The method of claim 1 wherein said programmable element is a programmable antifuse.

3. The method of claim 1 wherein said integrated circuit is a non-volatile memory device.

4. The method of claim 3 wherein said non-volatile memory device is a programmable read only memory.

5. The method of claim 1 wherein said integrated circuit is a dynamic random access memory.

6. The method of claim 1 wherein said conductivity type is N+.

7. The method of claim 1 wherein said conductivity type is P+.

8. The method of claim 1 wherein said edges cause a buildup of an electromagnetic field during an application of a programming pulse to said access device that is greater than a resulting electromagnetic field present in remaining antifuse interfacing surface.

9. The method of claim 8 wherein said programming pulse used to program said programmable is a voltage pulse having a potential under 14 V at a duration of less than 50 μsec.

10. A fabrication method to improve programmability of a one time programmable element in an integrated circuit, said method comprising the steps of:

a) masking a diffusion region adjoining neighboring access lines thereby exposing a portion of said adjoining diffusion region, said diffusion region being a heavily doped as a first conductivity type, said access devices forming active metal oxide transistors having overlying insulation means and dielectric spacers for isolation and said diffusion region for source/drain regions;

b) trenching through said exposed diffusion region thereby severing said diffusion region and forming edges in said severed diffusion region self-aligned to lower outer surface of said dielectric spacers;

c) etching back said dielectric spacers thereby exposing said edges of severed diffusion region;

d) doping said exposed edges thereby forming heavily doped edges having a second conductivity type;

e) forming a dielectric layer superjacent and coextensive resulting trench, said edges and said dielectric spacers; and f) forming a conductive layer superjacent and coextensive said dielectric thereby forming a programmable element comprising said dielectric layer sandwiched between said severed diffusion regions and said conductive layer.

11. The method of claim 10 wherein said programmable element is a programmable antifuse.

12. The method of claim 10 wherein said integrated circuit is a non-volatile memory device.

13. The method of claim 12 wherein said non-volatile memory device is a programmable read only memory.

14. The method of claim 10 wherein said integrated circuit is a dynamic random access memory.

15. The method of claim 10 wherein said first conductivity type is N−.

16. The method of claim 10 wherein said first conductivity type is P−.

17. The method of claim 10 wherein said second conductivity type is N+.

18. The method of claim 10 wherein said second conductivity type is P+.

19. The method of claim 10 wherein said edges cause a buildup of an electromagnetic field during an application of a programming pulse to said access device that is greater than a resulting electromagnetic field present in remaining antifuse interfacing surface.

20. The method of claim 19 wherein said programming pulse used to program said programmable is a voltage pulse having a potential under 14 V at a duration of less than 50 μsec.

21. A fabrication method to improve programmability to a one time programmable element in an integrated circuit, said method comprising the steps of:
   a) masking an N+ diffusion region adjoining neighboring access lines thereby exposing a portion of said adjoining diffusion region, said access devices forming active metal oxide transistors having overlying insulating means and dielectric spacers for isolation and said N+ diffusion region for source/drain regions;
   b) trenching through said exposed N+ diffusion region thereby severing said N+ diffusion region and forming edges in said severed N+ diffusion region self-aligned to lower outer surface of said dielectric spacers;
   c) etching back said dielectric spacers thereby exposing said edges of severed N+ diffusion region;
   d) forming a dielectric layer superjacent and coextensive resulting trench, said exposed edges and said dielectric spacers; and
   e) forming a conductive layer superjacent and coextensive said dielectric thereby forming a programmable antifuse element comprising said dielectric layer sandwiched between said severed N+ diffusion regions and said conductive layer.

22. The method of claim 21 wherein said integrated circuit is a non-volatile memory device.

23. The method of claim 22 wherein said non-volatile memory device is a programmable read only memory.

24. The method of claim 21 wherein said integrated circuit is a dynamic random access memory.

25. The method of claim 21 wherein said edges cause a buildup of an electromagnetic field during an application of a programming pulse to said access device that is greater than a resulting electromagnetic field present in remaining antifuse interfacing surface.

26. The method of claim 25 wherein said programming pulse used to program said programmable is a voltage pulse having a potential under 14 V at a duration of less than 50 μsec.

27. A fabrication method to improve programmability of a one time programmable element in an integrated circuit, said method comprising the steps of:
   a) masking an N+ diffusion region adjoining neighboring access lines thereby exposing a portion of said adjoining N+ diffusion region, said access devices forming active metal oxide transistors having overlying insulation means and dielectric spacers for isolation and said N+ diffusion region for source/drain regions;
   b) trenching through said exposed N+ diffusion region thereby severing said diffusion region and forming edges in said severed diffusion region self-aligned to lower outer surface of said dielectric spacers;
   c) etching back said dielectric spacers thereby exposing said edges of severed N+ diffusion region;
   d) doping said exposed edges thereby forming N− doped edges;
   e) forming a dielectric layer superjacent and coextensive resulting trench, said edges and said dielectric spacers; and
   f) forming a conductive layer superjacent and coextensive said dielectric thereby forming a programmable antifuse element comprising said dielectric layer sandwiched between said severed N− diffusion regions and said conductive layer.

28. The method of claim 27 wherein said integrated circuit is a non-volatile memory device.

29. The method of claim 28 wherein said non-volatile memory device is a programmable read only memory.

30. The method of claim 27 wherein said integrated circuit is a dynamic random access memory.

31. The method of claim 27 wherein said edges cause a buildup of an electromagnetic field during an application of a programming pulse to said access device that is greater than a resulting electromagnetic field present in remaining antifuse interfacing surface.

32. The method of claim 27 wherein said programming pulse used to program said programmable is a voltage pulse having a potential under 14 V at a duration of less than 50 μsec.

* * * * *